United States Patent [19]
Trefonas, III et al.

[11] Patent Number: 6,110,641
[45] Date of Patent: Aug. 29, 2000

[54] RADIATION SENSITIVE COMPOSITION CONTAINING NOVEL DYE

[75] Inventors: Peter Trefonas, III, Medway; Charles R. Szmanda, Westborough; Gerald C. Vizvary, Auburn, all of Mass.

[73] Assignee: Shipley Company, L.L.C., Marlborough, Mass.

[21] Appl. No.: 08/984,855

[22] Filed: Dec. 4, 1997

[51] Int. Cl.[7] .................................................. G03C 1/492
[52] U.S. Cl. ........................ 430/270.1; 430/325; 430/920
[58] Field of Search ................................ 430/270.1, 325, 430/920, 926, 927

[56] References Cited

U.S. PATENT DOCUMENTS

| | | | |
|---|---|---|---|
| 4,626,492 | 12/1986 | Effbeck | 430/191 |
| 4,828,960 | 5/1989 | Hertog | 430/191 |
| 5,164,279 | 11/1992 | Trefonas et al. | 430/191 |
| 5,178,986 | 1/1993 | Zampini et al. | 430/190 |
| 5,221,596 | 6/1993 | Keller | 430/324 |
| 5,340,697 | 8/1994 | Yoshimoto et al. | 430/270 |
| 5,342,727 | 8/1994 | Vicari et al. | 430/157 |
| 5,389,491 | 2/1995 | Tani et al. | 430/170 |
| 5,401,608 | 3/1995 | Pawlowski et al. | 430/270 |
| 5,725,994 | 3/1998 | Kondo | 430/270.1 |

FOREIGN PATENT DOCUMENTS

| | | | |
|---|---|---|---|
| 02296245 | 12/1990 | Japan | G03F 7/04 |

OTHER PUBLICATIONS

WPAT and JAPIO abstracts of JP 02296245, Dec. 1990.
English translation of JP 2296245A, Jun. 1990.
Derwent Info Ltd., Patent Abstract of Japanese Patent No. 59142538.

*Primary Examiner*—Janet Baxter
*Assistant Examiner*—Rosemary Ashton
*Attorney, Agent, or Firm*—Darryl P. Frickey; S. Matthew Cairns; Peter F. Corless

[57] ABSTRACT

A photoresist composition comprising an alkali soluble resin, a photoacid generating compound that undergoes photolysis when exposed to a pattern of activating irradiation within a wavelength of from 330 to 700 $\mu$m, a crosslinking agent capable of crosslinking the composition when activated by photogenerated acid and a dye that is an aromatic carboxylic acid having phenylazo substitution. The photoresist is characterized by the dye which is soluble in the photoresist solution, unreactive with components of the photoresist composition and may be used in relatively high concentration.

21 Claims, 1 Drawing Sheet

RADIATION SENSITIVE COMPOSITION CONTAINING NOVEL DYE

BACKGROUND OF THE INVENTION

1. Field of the Invention

This invention relates to dyes used for the formulation of photoresists, especially acid hardened photoresist formulations having a capability of providing highly resolved features of submicron dimension.

2. Description of the Prior Art

Photoresists are photosensitive films used for transfer of images to a substrate. They form negative or positive images. After coating a photoresist on a substrate, the coating is exposed through a patterned photomask to a source of activating energy such as ultraviolet light to form a latent image in the photoresist coating. The photomask has areas opaque to activating radiation and other areas transparent to activating radiation. The pattern in the photomask of opaque and transparent areas defines a desired image that may be used to transfer the image to a substrate. A relief image is provided by development of the latent image pattern in the resist coating. The use of photoresists is generally described, for example, by Deforest, *Photoresist Materials and Processes*, McGraw Hill Book Company, New York (1975), and by Moreau, *Semiconductor Lithography*, Principles, Practices and Materials, Plenum Press, New York (1988).

Known photoresists can provide features having resolution and size sufficient for many existing commercial applications. However for many other applications, the need exists for new photoresists that can provide highly resolved images of submicron dimension. One class of recently developed photoresists capable of enhanced resolution is known as the "acid hardened resists". These resists typically comprise a resin binder, a photoacid or photobase generator and one or more other materials that will result in curing, cross-linking or hardening of the composition upon exposure to activating radiation and heating as necessary to complete the cure. Acid hardening photoresists have been developed for imaging at essentially all conventional wavelengths such as g-line, i-line and deep ultraviolet (DUV).

A preferred acid hardening photoresist composition comprises a photoacid generator, a resin binder, and an amine-based cross-linker such as a melamine-formaldehyde resin exemplified by the Cymel resins available from American Cyanamid. These acid-hardening resists are described in numerous publications including European Patent Applications Nos. 0 164 248 and 0 232 972 and in U.S. Pat. No. 5,128,232, each incorporated herein by reference for their disclosure of conventional acid hardening photoresist compositions and processes for their use. The photoresists of these citations were developed primarily for DUV imaging.

Highly useful acid hardening photoresist compositions are disclosed in U.S. Pat. No. 5,128,232 to Thackeray et al. The patent discloses, inter alia, the use of a resist resin binder that comprises a copolymer of non-aromatic cyclic alcohol units and phenol units. The disclosed photoresists are also particularly suitable for exposure to deep ultraviolet (DUV) radiation. As is recognized by those in the art, DUV radiation refers to exposure of the photoresist to radiation having a wavelength in the range of about 350 nm or less, more typically in the range of about 300 nm or less.

Acid hardening resist compositions such as those disclosed in the above referenced documents provide fine line, high resolution images. However, imaging equipment most prevalent in the industry is adapted for i-line or g-line exposure and the acid hardening resist compositions of the above references are largely insensitive to these exposure wavelengths. Consequently, efforts have been made in the industry to formulate acid hardening photoresist compositions that may be imaged by i-line and g-line exposure.

In U.S. Pat. Nos. 3,954,475 and 3,987,307, both incorporated herein by reference, there is disclosed a class of vinyl-halomethyl-s-triazine compounds capable of photolysis and halogen acid free radical generation upon excitation at a radiation within the wavelength of from about 330 to 700 nanometers, a range that includes both i-line and g-line wavelengths. It is disclosed in these patents that the aforesaid halogenated triazines may be used for formulation of light sensitive compositions. Photoresists utilizing the triazine photoacid generators have been formulated for i-line and g-line imaging. Such photoresists are disclosed in the literature, for example in U.S. Pat. No. 4,189,323 and in European Patent Applns. 0 458 325; 0 519 298; and 0 621 509, each incorporated herein by reference. The photoresists disclosed in the patent and the European applications typically comprises an alkali soluble resin binder such as a phenolic resin, a crosslinking agent and the halomethyl triazine.

Regardless of the imaging radiation for the photoresist composition, it is extremely important that the photoresist exhibit uniform, constant line width, feature size, feature shape and thickness when patterned on a reflective rough semiconductor substrate or over reflective uneven topography. In this instance, light is reflected at an angle from the areas of the substrate into the photoresist causing localized regions of the photoresist to receive an additional dose of imaging radiation, which produces an undesirable profile shape and poor edge acuity after development. The loss of profile shape can severely limit the ability to successfully survive subsequent processing steps such as the etching of the underlying substrate. Uneven edge acuity can have highly deleterious effect on the electrical properties of a manufactured semiconductor device.

It is known in the art to add a dye to a photoresist composition to absorb stray reflections and thus diminish undesirable profile shapes giving excellent line width control and unexposed film thickness retention. In the *J. Electrochemical Society: Solid State Science and Technology*, Vol. 133, pp. 192–196 (1986), T. R. Pampalone and F. A. Kuyan describe the effect of the addition of Macrolex 60 dye to positive photoresist compositions. They found that the required exposure dose was increased by 220 to 520%. The sidewall angle of this composition was rather poor, about 60°–70°, indicating only moderate resolution. In *Solid State Technology*, pp. 125–130 (January, 1988), C. A. Mack described absorption properties of two dyed photoresist compositions in an article titled "Dispelling the Myths About Dyed Photoresist." The dyes described were Coumarin 314 and Macrolex 60. Neither dye is soluble in developer. The analysis reported in the above reference indicates that dyed resist compositions may not significantly improve lithographic processing.

U.S. Pat. No. 4,626,492 claims a photoresist composition containing 10–20 percent of a trihydroxybenzophenone and 0.1 to 3.0 percent dye, together with sensitizer and a specific novolak resin composition. The dyes claimed include anthroquinones, coumarins, diphenylmethanes, triphenylmethanes, phenanzines, oxazines, xantheses and phenylazo(4-dialkylamino)benzene. The function of the trihydroxybenzophenone is to increase the dissolution rate of this composition, thus enhancing the light sensitivity of the photoresist. However, the trihydroxybenzophenone additive has the significant disadvantage of being an in vitro mutagen (TSCA Report 8E HQ-0484-0510).

Japanese Patent No. 5,142,538 claims photoresist compositions containing selected phenyl- and naphthyl-azo compounds, including (4-phenylazo)- resorcinol. However the (4-phenylazo)resorcinol component has insufficient absorbency at 436 nm to be useful as the only dye compound in the composition when a mercury g-line wavelength is used to expose the resist coating.

Regardless of the dye used, problems are encountered by the addition of a dye to a photoresist composition. The dye in low concentration inadequately reduces reflected light from the substrate. In higher concentration, the dye competes with the photoresist components for the light thus decreasing sensitivity of the photoresist composition. Other problems include undesirable reaction with resist components and poor solubility in the photoresist composition.

SUMMARY OF THE INVENTION

The present invention is directed to an acid hardening photoresist composition characterized by addition of a dye that is an aromatic carboxylic acid substituted with a phenylazo chromophore. The dye has been found to be fully soluble in the photoresist composition thus avoiding formation of a separate heterogeneous phase in a photoresist coating, has high adsorbance at exposing wavelength thereby dampening photospeed variation with coating thickness, and may be used in relatively high concentration whereby image profile may be formed with a retrograde sidewall angle, a desirable feature for metal lift-off processing.

DESCRIPTION OF THE PREFERRED EMBODIMENTS

Figure 1:
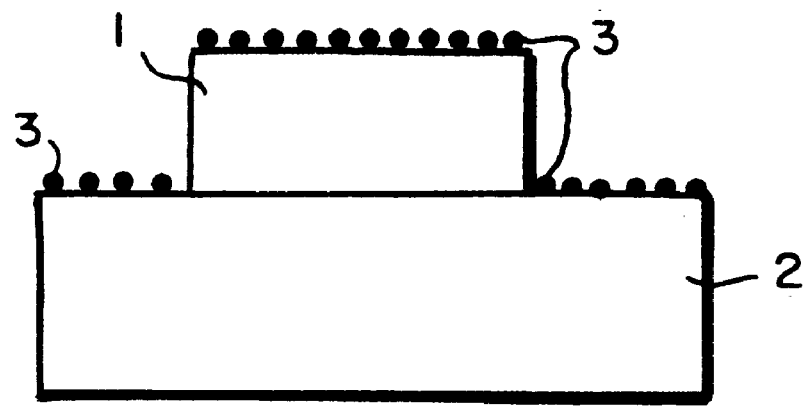
FIG. 1 represents a photoresist image coated over a substrate using a lift off process where the photoresist is a conventional photoresist.

As described above, the photoresist composition of the invention comprises an alkali soluble resin binder, a halogenated photoactive generator, a crosslinking agent and a dye that is an aromatic carboxylic acid having phenylazo substitution.

Exemplary alkali soluble resins are novolak resins, poly(vinylphenol) resins, polystyrenes, copolymers of vinyl phenols with various acrylate monomers such as methacrylate, etc. Preferred resins are novolak resins, polyvinylphenol resins and mixtures of the two. The preferred novolak and poly(vinylphenol) may be in the form of copolymers with cyclic alcohols if desired as disclosed in U.S. Pat. No. 5,128,232.

Procedures for the preparation of conventional novolak and poly(vinylphenol) resins used as photoresists binders are well known in the art and disclosed in numerous publications including those discussed above. Novolak resins are the thermoplastic condensation products of a phenol and an aldehyde. Examples of suitable phenols for condensation with an aldehyde, especially formaldehyde, for the formation of novolak resins include phenol; m-cresol; o-cresol; p-cresol; 2,4-xylenol; 2,5-xylenol; 3,4-xylenol; 3,5-xylenol and thymol. An acid catalyzed condensation reaction results in the formation of a suitable novolak resin which may vary in molecular weight from about 500 to 100,000 daltons. The preferred novolak resins conventionally used for the formation of photoresists are the cresol formaldehyde condensation products.

Poly(vinylphenol) resins are thermoplastic polymers that may be formed by block polymerization, emulsion polymerization or solution polymerization of the corresponding monomers in the presence of a cationic catalyst. Vinylphenols useful for the production of poly(vinylphenol) resins may be prepared, for example, by hydrolysis of commercially available coumarin or substituted coumarins, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or non-substituted hydroxybenzaldehydes with malonic acid. Preferred poly(vinylphenol) resins prepared from such vinylphenols have a molecular weight range of from about 2,000 to about 100,000 daltons As noted, phenolic copolymers may be used as binders for the photoresist compositions of this invention. These copolymers comprise phenols and nonaromatic cyclic alcohols analogous in structure to the novolak resins and poly(vinylphenol) resins. These polymers may be formed in several ways. For example, in the conventional preparation of a poly(vinylphenol) resin, a cyclic alcohol may be added to the reaction mixture as a comonomer during the polymerization reaction which is thereafter carried out in normal manner. The cyclic alcohol is preferably aliphatic, but may contain one or two double bonds. The cyclic alcohol is preferably one closest in structure to the phenol reactant. For example, if the resin is a polyvinyl phenol, the comonomer would be vinyl cyclohexanol.

A preferred method for formation of the polymer comprises partial hydrogenation of a preformed novolak resin or a preformed polyvinyl phenol resin. Hydrogenation may be carried out using art recognized hydrogenation procedures; for example, by passing a solution of the phenolic resin over a reducing catalyst such as a platinum or palladium coated carbon substrate, or preferably Raney nickel, at elevated temperature and pressure. The specific conditions are dependent upon the polymer to be hydrogenated. More particularly, the polymer is dissolved in a suitable solvent such as ethyl alcohol or acetic acid, and then the so formed solution is contacted with a finely divided Raney nickel catalyst and allowed to react at a temperature of from about 100° to 300° C. at a pressure of from about 50 to 300 atmospheres or more. The finely divided nickel catalyst may be a nickel-on-silica, nickel-on-alumina, or nickel-on-carbon catalyst depending upon the resin to be hydrogenated. Hydrogenation is believed to reduce the double bonds in some of the phenolic units resulting in a random copolymer of phenolic and cyclic alcohol units in percentages dependent upon the reaction conditions used.

The alkali soluble resin may be a single resin or a mixture of resins. A mixture of resins is preferred. In addition, as is known in the art, the hydroxyl groups or either resin may be substituted with either an acid labile or an acid inert group. Typical examples of suitable blocking groups include alkoxy groups such as methoxy, ethoxy, propoxy, n-butoxy, sec-butoxy, t-butoxy, etc.; alkyl esters represented by RCOO— wherein R is preferably an alkyl group having 1–4 carbon atoms such as methyl, ethyl, propyl, isopropyl and butyl, sec-butyl, t-butyl, etc.; a sulfonyl acid ester such as methanesulfonyl, ethanesulfonyl, propanessulfonyl, benzenesulfonyl and toluene-sulfonyl esters, etc. In the most preferred embodiment of the invention, the resin mixture is a polyvinylphenol resin having a minor portion of its hydroxyl groups mesylated admixed with a novolak resin.

In addition to the resin, the photoresist contains a photo-acid generator. The photoacid generator undergoes photolysis to yield an acid upon exposure to activating radiation. Suitable photoacid generators include, by way of example, 1,1-bis[p-chlorophenyl]-2,2,2-trichloroethane (DDT); 1,1-bis[p-methoxyphenyl]-2,2,2-trichloroethane; 1,2,5,6,9,10-hexa bromocyclododecane; 1,10-dibromodecane; 1,1-bis[p-chlorophenyl]-2,2-dichloroethane; 4,4'-dichloro-2-(trichloromethyl)benzhydrol or 1,1-bis(chlorophenyl)-2,2,2-trichloroethane; hexachlorodimethyl sulfone; 2-chloro-6-(trichloromethyl)pryidine; o,o-diethyl-o-(3,5,6-trichloro-2-pyridyl)phosphorothioate; 1,2,3,4,5,6-hexachlorocyclohexane; N(1,1-bis[p-chlorophenyl]-2,2,2-trichoroethyl acetamide; tris [2,3-dibromopropyl] isocyanurate; 2,2-bis[p-chlorophenyl]-1,1-dichloroethylene; and halomethyl-s-triazines. Of the above exemplified halogenated photoacid generators, the halomethyl-s-triazines are preferred. Such compounds conform to the following formulae:

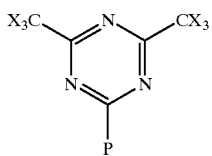

where P represents a trihalomethyl group, a substituted or unsubstituted phenyl group or a substituted or unsubstituted naphthyl group and each X may be the same or different and each represents a halogen atom.

A preferred halomethyl-s-triazine conforms to the following structure:

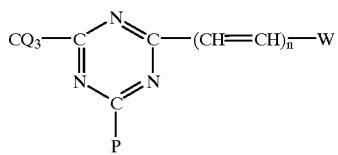

wherein Q is bromine or chlorine, P is —CQ$_3$, —NH$_2$, —NHR, —NR$_2$, or —OR where R is phenyl or lower alkyl (lower alkyl meaning an alkyl group having no more than 6 carbon atoms); n is an integer from 1 to 3; and W is an optionally substituted aromatic or heterocyclic nucleus or

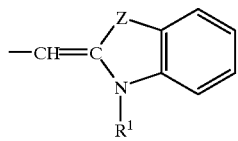

where Z is oxygen or sulfur and R$^1$ is hydrogen, a lower alkyl or phenyl group. Of course, where W is an aromatic or heterocyclic nucleus, the ring may be optionally substituted. Without attempting an exhaustive listing of substituents, the following are noted as typical: chloro, bromo, phenyl, lower alkyl (an alkyl having no more than 6 carbon atoms), nitro phenoxy, alkoxy, acetoxy, acetyl, amino, and alkyl amino.

The s-triazine compounds as described above generate free radicals when irradiated with actinic radiation of a wavelength from about 330 to about 700 millimicrons. For this reason, the compounds are useful as photoinitiators in light sensitive compositions within the i-line and g-line wavelengths.

The s-triazine compounds are condensation reaction products of certain methyl-halomethyl-s-triazines and certain aldehydes or aldehyde derivatives. They may be prepared by the procedures disclosed in the above cited U.S. Pat. No. 3,954,475 and in accordance with the teachings of Wakabayashi et al., Bulletin of the Chemical Society of Japan, 42, 2924-30 (1969).

Specific examples of halogenated triazines suitable for use as photoacid generators in the invention include for example, 2-[1-(3,4-benzodioxolyl)]-4,6-bis(trichloromethyl)-1,2,5-triazine, 2-[1-(2,3-benzodioxolyl)]-4,6-bis(trichloromethyl)-1,3,5-triazine, 2-[1-(3,4-benzodioxolyl)]-4,6-bis(tribromomethyl)-1,3,5-triazine, 2-[1-(2,3-benzodioxolyl)]-4,6-bis(tribromomethyl)-1,3,5-triazine, 2-(2-furylethylidene)-4,6-bis(trichloromethyl)-1,3,5-triazine, 2-[2-(5-methylfuryl)ethylidene]-4,6-bis(trichloromethyl)-1,3,5-triazine, 2-[2-(4-methylfuryl)ethylidene]-4,6-bis(trichloromethyl)-1,3,5-triazine, 2-[2-(3-methylfuryl)ethylidene]-4,6-bis-(trichloromethyl)-1,3,5-triazine, 2-[2-(4,5-dimethylfuryl)ethylidene]-4,6-bis(trichloromethyl)-1,3,5-triazine, 2-[2-(5-methoxyfuryl)ethylidene]-4,6-bis(trichloromethyl)-1,3,5-triazine, 2-[2-(4-methoxyfuryl)ethylidene]-4,6-bis(trichloromethyl)-1,3,5-triazine, 2-[2-(3-methoxyfuryl)ethylidene]-4,6-bis(trichloromethyl)-1,3,5-triazine, 2-[2-(4,5-dimethoxy-furyl)ethylidene]-4,6-bis(trichloromethyl)-1,3,5-triazine, 2-(2-furylethylidene)-4,6-bis(tribromomethyl)-1,3,5-triazine, 2-[2-(5-methylfuryl)ethylidene]-4,6-bis(tribromomethyl)j-1,3,5-triazine, 2-[2-(4-methylfuryl)-ethylidene]-4,6-bis(tribromomethyl)-1,3,5-triazine, 2-[2-(3-methylfuryl) ethylidene]-4,6-bis(tribromomethyl)-1,3,5-triazine, 2-[2-(4,5-dimethoxyfuryl)ethylidene]-4,6-bis(tribromomethyl)-1,3,5-triazine, 2-[2-(5-methoxyfuryl)ethylidene]- 4,6-bis(tribromomethyl)-1,3,5-triazine, 2-[2-(4-methoxyfuryl)ethylidene]-4,6-bis(tribromomethyl)-1,3,5-triazine, 2-[2-(3-methoxyfuryl)ethylidene]-4,6-bis(tribromomethyl)-1,3,5-triazine, 2-[2-(4,5-dimethoxyfuryl)ethylidene]-4,6- bis(tribromomethyl)-1,3,5-triazine, 2,4,6-tris-(trichloromethyl)-1,3,5-triazine, 2,4,6-tris-(tribromomethyl)-1,3,5-triazine, 2-phenyl-4,6-bis(trichloromethyl)-1,3,5-triazine, 2-phenyl-4,6-bis(tribromomethyl)-1,3,5-triazine, 2-(4-methoxyphenyl)-4,6-bis(trichloromethyl)-1,3,5-triazine, 2-(4-methoxyphenyl)-4,6-bis(tribromomethyl)-1,3,5-triazine, 2-(1-naphthyl)-4,6-bis(trichloromethyl)-1,3,5-triazine, 2-(1-naphthyl)-4,6-bis(tribromomethyl)-1,3,5-triazine, 2-(4-methoxy-1-naphthyl)-4,6-bis(trichloromethyl)-1,3,5-triazine, 2-(4-methoxy-1-naphthyl)-4,6-bis(tribromomethyl)-1,3,5-triazine, 2-(4-chlorophenyl)-4,6-bis(tribromomethyl)-1,3,5-triazine, 2-styryl-4,6-bis(trichloromethyl)-1,3,5-triazine, 2-styryl-4,6-bis(tribromomethyl)-1,3,5-triazine, 2-(4-methoxystyryl)-4,6-bis(trichloromethyl)-1,3,5-triazine, 2-(4-methoxystyryl)-4,6-bis(tribromomethyl)-1,3,5-triazine, 2-(3,4,5-trimethoxystyryl)-4,6-bis(trichloromethyl)-1,3,5-triazine, 2-(3,4,5-trimethoxystyryl)-4,6-bis(tribromomethyl)-1,3,5-triazine, 2-(3-chloro-1-phenyl)-4,6-bis(trichloromethyl)-1,3,5-triazine, 2-(3-chlorophenyl)-4,6-bis(tribromomethyl)-1,3,5-triazine and the like.

Other triazine type photoacid generators that may be used for i-line and g-line exposure are disclosed in EP application 0,458,325.

The acid-generating agents may be used alone or in admixture. The amount of acid generator may vary from about 0.01 to 5 parts by weight, preferably 0.1 to 3 parts by weight, per 100 parts by weight of the specific alkali soluble resin. When the amount of the acid-generator is less than 0.01 parts by weight, it is difficult to form a resist pattern and when the amount exceeds 5 parts by weight, the ability to strip the resist from the substrate becomes difficult.

The cross-linking agent used is preferably a compound having a methylol group and/or alkoxymethyl group that is capable of cross-linking the specific resin upon heating in the presence of a photogenerated acid. When the cross-linking agent has at least two alkoxymethyl groups, they may be the same as or different from one another.

Typical cross-linking agents include, by way of example, a urea-formaldehyde resin, a thiourea-formaldehyde resin, a melamine-formaldehyde resin, a guanamine-formaldehyde resin, a benzoguanamine-formaldehyde resin, a glycoluril-formaldehyde resin and the like.

Among these cross-linking agents, particularly preferable are compounds represented by the following formulas and oligomers derived from these compounds and having a Mw of 1,500 or less:

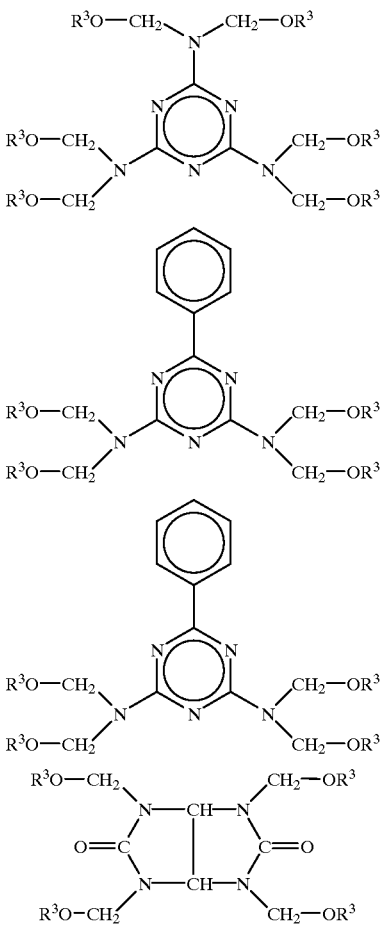

where each $R^3$ may be the same as or different and each represents a hydrogen atom or an alkyl group having 1 to 6 carbon atoms.

A number of compounds represented above are commercially available as, for example, CYMEL (a trade name of Mitsui Cyanamid Co., Ltd.) and Nikalac (a trade name of Sanwa Chemical Co., Ltd.).

These cross-linking agents may be used alone or in admixture. The amount of cross-linking agent may vary from about 1 to 10 parts by weight and more, preferably from 1 to 7 parts by weight, per 100 parts by weight of the resin. When the amount of the cross-linking agent used is less than 1 part by weight, curing of irradiated portions of the composition becomes difficult. When the amount exceeds 10 parts by weight, strippability of the resist coating becomes difficult.

The photoresist of the invention is characterized by addition of a dye that is an azo dye of an aromatic carboxylic acid. A preferred dye in accordance with the invention may be represented by the following formula:

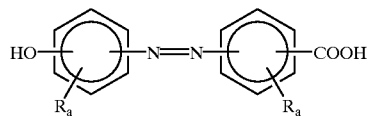

where each R is independently selected from the group consisting of hydrogen, lower alkyl, hydroxyl, carboxyl, amino, nitro, halogens and ethers, and each a is a whole integer equal to from 1 to 3. Exemplary dyes conforming to the above formula include 2-(4-hydroxyphenylazo)benzoic acid, 4-(4-hydroxyphenylazo)benzoic acid, 2-(4-hydroxy-3, 3'-dimethylphenylazo)benzoic acid, 2-(4-hydroxy-3,3-dichlorophenylazo)benzoic acid, etc. It is preferred that the dye used have a purity in excess of 99.9 weight percent.

The dye is added to the photoresist composition in minor amounts, preferably in an amount of from 0.05 to 6% by weight and more preferably, in an amount of from 0.5 to 4% by weight. It should be noted that the dye of the invention may be added in greater concentration than dyes heretofore used in photoresist compositions, as soluble in the photoresist composition within the concentration limits set forth herein and does not react with components of the photoresist composition. In this respect, it is unexpected and surprised that the dye is unreactive with photoactive generators that are trihalomethyltriazines as depicted in the formulae above.

The ability to add the dye in large concentration permits use of the photoresist for metal lift-off processing. For example, when used in concentrations above about 2%, developed photoresist images have a retrograde sidewall angle- i.e., a profile resembling an inverse trapezoid. This is especially useful for gallium arsenide lithography where metal lift-off is often a conventional processing step. As is known in the art, lift-off is a technique for forming patterns over the surface of a wafer by an additive process, as opposed to removal by a subtractive process using an etchant. In lift-off, an inverse pattern is first formed in a resist layer coated over the wafer thereby exposing the substrate at specific locations. Next, the film to be patterned is deposited over the inverse-patterned resist layer and the exposed substrate. Those portions which are deposited on the resist layer are removed when the wafer is immersed in a developer capable of dissolving the resist layer. In other words, the deposited film on the resist layer is lifted-off during dissolution of the resist layer. The film material deposited on the exposed substrate regions remain behind as the required pattern. The potential requirement for a successful lift-off process is to insure that a distinct break exists between the film material on the top of the resist layer and that deposited on the exposed substrate. This separation allows the developer to reach and attack the resist layer and also ensures that the film atop the resist layer is free to be lifted off.

Figure 2:
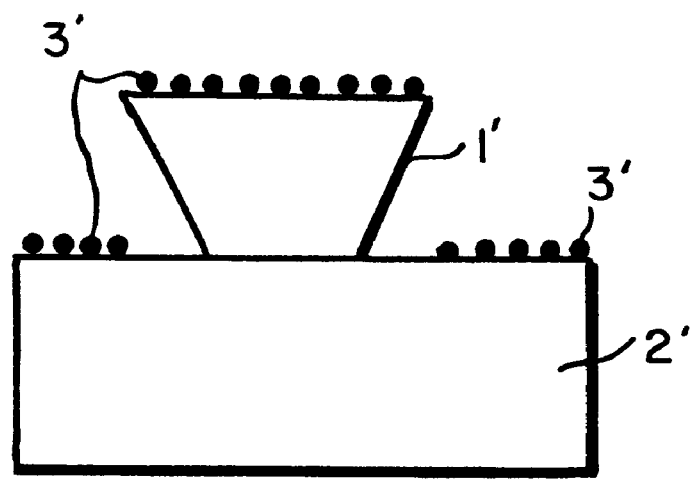
FIG. 2 represents the same coated photoresist image over a substrate used in a lift off process where the photoresist of FIG. 1 contains the dye of the invention.

The use of the dyes identified above in accordance with the invention is especially suitable for enhancing resist lift-off procedure as a consequence of the formation of developed coatings having retrograde wall angles. This is illustrated in FIGS. 1 and 2 of the drawings. In FIG. 1, there is shown a photoresist image 1 over substrate 2 having a coating of vapor deposited metal 3 over its surface. From the Figure, it can be seen that the vapor deposited metal is continuous over all surfaces of the wafer and the imaged photoresist coating. Consequently, because of the continuous nature of the coating, clean separation between the metal deposit on the substrate and the metal deposited on the photoresist layer is difficult to achieve. In contrast, FIG. 2 shows the developed photoresist coating 1' over substrate 2' coated with vapor deposited metal 3'. The photoresist used in this example would contain the dye of the invention. It can be seen that the developed image has a retrograde wall angle in that it slopes inwardly to form a trapezoidal cross section. As a consequence, during vapor deposition, vapor deposits only on substrate 2' and on the top surfaces of the developed photoresist image. It does not deposit over the metal substrate shaded by the retrograde photoresist coating. Because the metal deposit is not continuous, developer readily reaches and dissolves the photoresist coating and the metal deposit over the photoresist coating is cleanly lifted off or removed as the photoresist dissolves.

From the above, it can be seen that an advantage resulting from use of the resist of this invention for lift-off processing, as opposed to other types of liftoff schemes, is a simple single-layer process. The required retrograde wall angle is achieved without resorting to multilayer resist processes, auxiliary layers, polyimide intermediary layers or overplated metal layering. In addition, retrograde wall angle in this resist prevents "wing tips" or "burrs", difficult-to-control boundary crack processes needed for later liftoff when the profile is not very retrograde, curling of barrier layers in multilayer processes and additional acid-etch back processing. Finally, the process is low in cost to perform.

The photoresist may also contain a minor amount of a strong base to neutralize acid migrating into the unexposed regions of the photoresist. Organic amines are preferred bases. Typical organic amines include trimethyl amine, diethyl amine, triethyl amine, dipropyl amine, tripropyl amine, di-isopropyl amine, allyl amine, diallylamine, n-butylamine, dibutylamine, isobutylamine, sec-butylamine, tert-butylamine, dimethyl butylamine, di-n-amylamine, tri-n-amylamine, dicyclohexoamine, etc. Preferred amines are lower trialkyl amines such as triethylamine, tripropylamine and tributylamine. The concentration of the base is small, typically from about a trace up to about 1.5 percent by weight of the composition.

The above compositions are dissolved in a solvent to make a coating composition. The solids content may vary between 5 and 40% by weight of solids and prior to use, the compositions is preferably passed through a filter having a pore diameter of, for example, about 0.2 μm. The solvent used to prepare the composition may include, for example, methyl cellosolve, ethyl Cellosolve, methyl Cellosolve acetate, ethyl Cellosolve acetate, propylene glycol ethyl ether acetate, propylene glycol ethyl ether acetate, propylene glycol propyl ether acetate, toluene, xylene, methyl ethyl ketone, cyclohexanone, methyl 2-hydroxypropionate, ethyl 2-hydroxypropionate, ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutanate, 3-methyl-3-methoxybutyl acetate, 3-methyl-3-methoxybutyl propionate, 3-methyl-3-methoxybutyl butanate, ethyl acetate, butyl acetate, methyl pyruvate, ethyl pyruvate and the like. The above solvents may be used alone or in admixture of two or more. Ethyl lactate comprises a preferred solvent.

Photoresist compositions of the invention are used in conventional manner. They are coated onto a substrate such as a silicon wafer such as by spin coating, roller coating or the like and dried to form a film. Thereafter, the film is irradiated through a desired pattern to form a latent image in the resist coating. The radiation used for purposes of this invention is i-line and g-line irradiation. Exposure conditions are in accordance with conventional methods used in the prior art. Following exposure, the exposed film is heat treated to cross-link the polymer which cross-linking reaction is activated by photogenerated acid. Typical heat treatment conditions may vary between 40 and 160° C. Following heat treatment, the resist film is developed with a developer such as an aqueous alkaline solution of sodium hydroxide, potassium hydroxide, sodium carbonate, triethylamine, dimethylethanolamine, triethanolamine, tetramethylammoniumhydroxide, etc.

The invention will be better understood by reference to the examples that follow.

Examples 1–4

Effects of Varying the Amount of Dye in Thin (1.0 μm) Film Resist

The effect of varying the amount of 2-(4-hydroxyphenylazo)benzoic acid (HABA) dye on the resist profile shape, photospeed and lithographic performance was studied. First a batch of negative resist composition without dye was prepared. To this composition, various amounts of HABA dye were added and the resulting resist was processed according to standard lithographic protocols. As such, the dye-less batch of negative resist was prepared by dissolving the following components into a single liquid phase-phase composition which was filtered by passing it through a 0.2 μm teflon filter:

| | |
|---|---:|
| novolac resin (condensate of m-cresol, 35%; p-cresol, 60%; 2,5-xylenol, 5% with formaldehyde) | 403.6 g |
| poly(4-hydroxystyrene 79%, co-4-methylsulphonyl-phenylstyrene, 21%) | 403.6 g |
| Cymel 303 (hexamethoxymelamine) | 106.2 g |
| 4-methoxystyryl-bis(trichloromethyl)triazine | 9.3 g |
| tetrabutylammonium hydroxide | 3.1 g |
| Silwet 7604 | 1.4 g |
| Ethyl lactate | 2857.7 g |

| Example | wt undyed composition | wt of HABA dye | dye, % of solids |
|---|---|---|---|
| 1 | 800 | 0 | 0 |
| 2 | 800 | 4.0 | 2.0 |
| 3 | 800 | 7.1 | 3.5 |
| 4 | 800 | 10.3 | 5.0 |

After the dye addition, the photoresist composition was filtered through a 0.2 μm teflon filter. Thereafter, the liquid photoresist was dispensed onto a clean primed 100 mm silicon and spun at a spin speed of about 4000 RPM to achieve a 1.00 μm film thickness after a 110° C./60 sec. post-apply bake. The resist films were exposed using a 0.55 NA GCA I-line 365 nm) wafer stepper, and then the wafer was subjected to a 110° C./60 sec. post-exposure bake. Development was by a track single-puddle process using 0.262N tetramethylammonium hydroxide/water at 21° C. Lithographic results are listed below (wall angles >90 are retrograde):

| Example | Esize (mJ/cm2) | resolution ($\mu$m) | wall angle at 0.40 $\mu$m |
|---|---|---|---|
| 1 | 95 | 0.325 | 89 |
| 2 | 128 | 0.375 | 93 |
| 3 | 179 | 0.375 | 93.5 |
| 4 | 231 | 0.375 | 95 |

Results indicate that examples 2 to 4 exhibited retrograde wall angles which are suitable for liftoff processing. Example 3 showed the best tradeoff between achieving a retrograde wall angle useful for liftoff processing, profile shape and sufficiently fast photospeed and thus constitutes a preferred embodiment of the invention.

Examples 5–6

Effects of Adding HABA Dye to a Thicker-film Photoresist

Example 5: An undyed batch of photoresist was prepared by dissolving the following materials to make a single-phase liquid composition:

| | |
|---|---|
| novolac (condensate of m-cresol, 35%; p-cresol, 60%; 2,5-xylenol, 5% with formaldehyde) | 21.007 g |
| poly(4-hydroxystyrene, 79%, co-4-methylsulphonyl-phenylstyrene, 21%) | 21.007 g |
| Cymel 303 (hexamethoxymelamine) | 5.504 g |
| 4-methoxystyryl-bis(trichloromethyl)triazine | 0.242 g |
| methoxy-naphthyl-bis(trichloromethyl)triazine | 0.242 g |
| Silwet 7604 | 0.072 g |
| tetrabutylammoniumhydroxide | 0.158 g |
| ethyl lactate | 101.93 g |

Example 6: A dyed batch of photoresist was prepared by dissolving the following materials to make a single-phase liquid composition:

| | |
|---|---|
| novolac (condensate of m-cresol, 35%; p-cresol, 60%; 2,5-xylenol, 5% with formaldehyde) | 21.007 g |
| poly(4-hydroxystyrene, 79%, co-4-methylsulphonyl-phenylstyrene, 21%) | 21.007 g |
| Cymel 303 (hexamethoxymelamine) | 5.504 g |
| 4-methoxystyryl-bis(trichloromethyl)triazine | 0.242 g |
| methoxy-naphthyl-bis(trichloromethyl)triazine | 0.242 g |
| HABA dye | 0.960 g |
| Silwet 7604 | 0.072 g |
| tetrabutylammoniumhydroxide | 0.158 g |
| ethyl lactate | 101.930 g |

The resists were filtered and processed in a manner similar to that described in examples 1–4, except that the film thickness was 3.0 $\mu$m. Lithographic results are listed below where wall angles >90 are retrograde.

| Example No. | Esize (mJ/cm2) | resolution ($\mu$m) | wall angle at 1.0 $\mu$m |
|---|---|---|---|
| 5 | 76 | 0.80 | 92° |
| 6 | 138 | 0.70 | 97° |

The above results indicate that example 6 exhibited a retrograde wall angle which was for liftoff processing.

We claim:

1. A negative-acting photoresist composition comprising an alkali soluble resin, a triazine photoacid generating compound that undergoes photolysis when exposed to a pattern of activating irradiation within a wavelength of from 330 to 700 $\mu$m, a crosslinking agent and a dye represented by the formula:

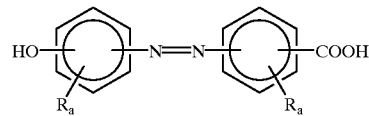

where each R is independently selected from the group consisting of hydrogen, lower alkyl, hydroxyl, carboxyl, amino, nitro, halogens and ethers, and each a is independently 1, 2 or 3.

2. The photoresist of claim 1 where each R is selected from the group consisting of hydrogen, lower alkyl having from 1 to 6 carbon atoms and halo.

3. The photoresist of claim 4 where each R is hydrogen.

4. The photoresist of claim 1 where the dye is present in an amount of 0.05 to 6 percent by weight.

5. The photoresist of claim 4 where the amount varies between 0.5 and 4%.

6. The photoresist of claim 1 where the dye has a purity in excess of 99.9 percent by weight.

7. The photoresist composition of claim 1 wherein the photoacid generating compound conforms to the formula:

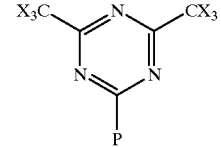

where P represents a trihalomethyl group, a substituted or unsubstituted phenyl group or a substituted or unsubstituted naphtyl group and each X may be the same or different and each represents a halogen atom.

8. The photoresist composition of claim 1 wherein the photoacid generating compound conforms to the formula:

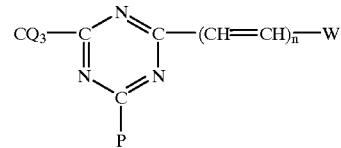

where Q is bromine or chlorine, P is —CQ$_3$, —NH$_2$, —NHR, —NR$_2$, or —OR where R is phenyl or lower alkyl having up to 6 carbon atoms; n is an integer of from 1 to 3; and W is an optionally substituted aromatic or heterocyclic nucleus or

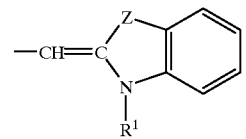

where Z is oxygen or sulfur and R$^1$ is hydrogen, a lower alkyl or phenyl group.

9. A method for forming an image over a substrate, said method comprising the steps of:

a. coating a substrate with a photoresist composition comprising an alkali soluble resin, a photoacid generating compound that undergoes photolysis when exposed to a pattern of activating irradiation within a wavelength of from 330 to 700 μm, a crosslinking agent capable of crosslinking the composition when activated by photogenerated acid and a dye that is an aromatic carboxylic acid having phenylazo substitution, b. exposing and developing said photoresist coating to form an image having a retrograde sidewall angle, c. vapor depositing metal over the developed photoresist coating and underlying substrate, and d. dissolving the exposed and developed photoresist coating while simultaneously undercutting and washing the metal deposit from the surface of the photoresist.

10. The method of claim 9 where the photoacid generating compound conforms to the formula:

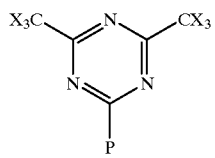

where P represents a trihalomethyl group, a substituted or unsubstituted phenyl group or a substituted or unsubstituted naphthyl group and each X may be the same or different and each represents a halogen atom.

11. The method of claim 9 where the photoacid generating compound conforms to the formula:

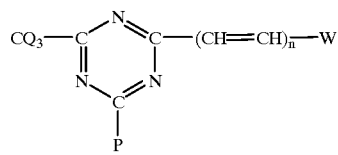

wherein Q is bromine or chlorine, P is $-CQ_3$, $-NH_2$, $-NHR$, $-NR_2$, or $-OR$ where R is phenyl or lower alkyl having up to 6 carbon atoms; n is an integer from 1 to 3; and W is an optionally substituted aromatic or heterocyclic nucleus or

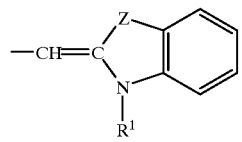

where Z is oxygen or sulfur and $R^1$ is hydrogen, a lower alkyl or phenyl group.

12. The method of claim 9 where the dye conforms to the formula:

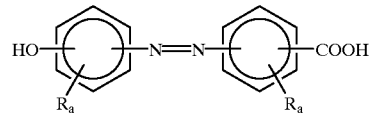

where each R is independently selected from the group consisting of hydrogen, lower alkyl, hydroxyl, carboxyl, amino, nitro, halogens and ethers, and each a is a whole integer equal to from 1 to 3.

13. The method of claim 12 where each R is selected from the group consisting of hydrogen, lower alkyl having from 1 to 6 carbon atoms and halo.

14. The method of claim 12 where each R is hydrogen.

15. The method of claim 9 where the dye is 2-(4-hydroxyphenylazo)benzoic acid.

16. The method of claim 9 where the dye is present in an amount of 0.05 to 6 percent by weight.

17. The method of claim 16 where the amount varies between 0.5 and 4%.

18. The method of claim 9 where the dye has a purity in excess of 99.9 percent by weight.

19. A negative-acting photoresist composition comprising an alkali soluble resin, a triazine photoacid generating compound that undergoes photolysis when exposed to a pattern of activating irradiation within a wavelength of from 330 to 700 μm, a crosslinking agent and a dye that is an aromatic carboxylic acid having phenylazo substitution.

20. A method of forming an image over a substrate, comprising:

a) coating a substrate with a photoresist composition comprising an alkali soluble resin, a photoacid generating compound, a crosslinking agent capable of crosslinking the composition when activated by photogenerated acid and a dye that is an aromatic carboxylic acid having phenylazo substitution;

b) exposing and developing the photoresist coating to form an image having a retrograde sidewall angle;

c) vapor depositing metal over the developed photoresist coating and underlying substrate; and d) dissolving the exposed and developed photoresist coating while simultaneously undercutting and washing the metal deposit from the surface of the photoresist.

21. The method of claim 20 wherein the photoacid generating compound is a triazine compound.

* * * * *